United States Patent [19]

Rabindran

[11] 4,173,029
[45] Oct. 30, 1979

[54] PROTECTIVE CIRCUIT FOR SELECTIVELY APPLYING POWER TO A MOTOR

[75] Inventor: K. George Rabindran, Morton Grove, Ill.

[73] Assignee: Bell & Howell Company, Chicago, Ill.

[21] Appl. No.: 888,267

[22] Filed: Mar. 20, 1978

[51] Int. Cl.² .............................................. H02H 7/00
[52] U.S. Cl. ...................................... 361/3; 242/203; 318/8
[58] Field of Search ................. 361/3, 8, 13, 189, 190; 318/4, 5, 7, 8, 10, 39, 129, 131, 132, 285, 286, 345 E, 345 F, DIG. 1; 242/201, 203

[56] References Cited
U.S. PATENT DOCUMENTS

| | | | |
|---|---|---|---|
| 2,845,580 | 7/1978 | Smith | 361/13 X |
| 3,260,912 | 7/1966 | Gregory | 318/345 E |
| 3,739,192 | 6/1973 | Oswald | 361/3 |
| 4,121,138 | 10/1978 | Flint et al. | 318/7 |

FOREIGN PATENT DOCUMENTS 1265304 4/1968 Fed. Rep. of Germany ............. 361/13
4731526 10/1968 Japan .................................... 318/345 F Primary Examiner—Harry E. Moose, Jr.
Attorney, Agent, or Firm—Harry G. Thibault; Alan B. Samlan

[57] ABSTRACT

A protective circuit is described for selectively applying power to a motor. The circuit includes a power switch which closes and opens to apply and remove power from the motor, and a control for diverting reactively inducted motor current from the power switch back to the motor via a current path when the power switch is opened. The control opens the current path when the power switch opens and remains open for a predetermined interval so that, when the motor is unenergized and mechanically rotated, the motor is not braked by current flow through the current path and the motor.

14 Claims, 5 Drawing Figures

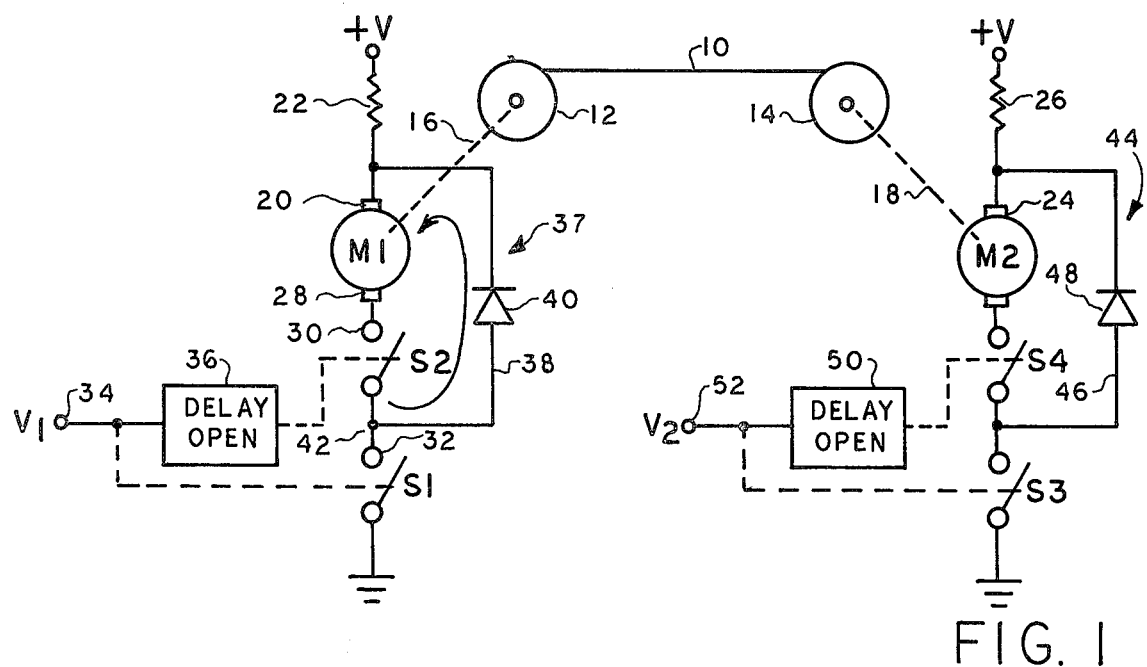
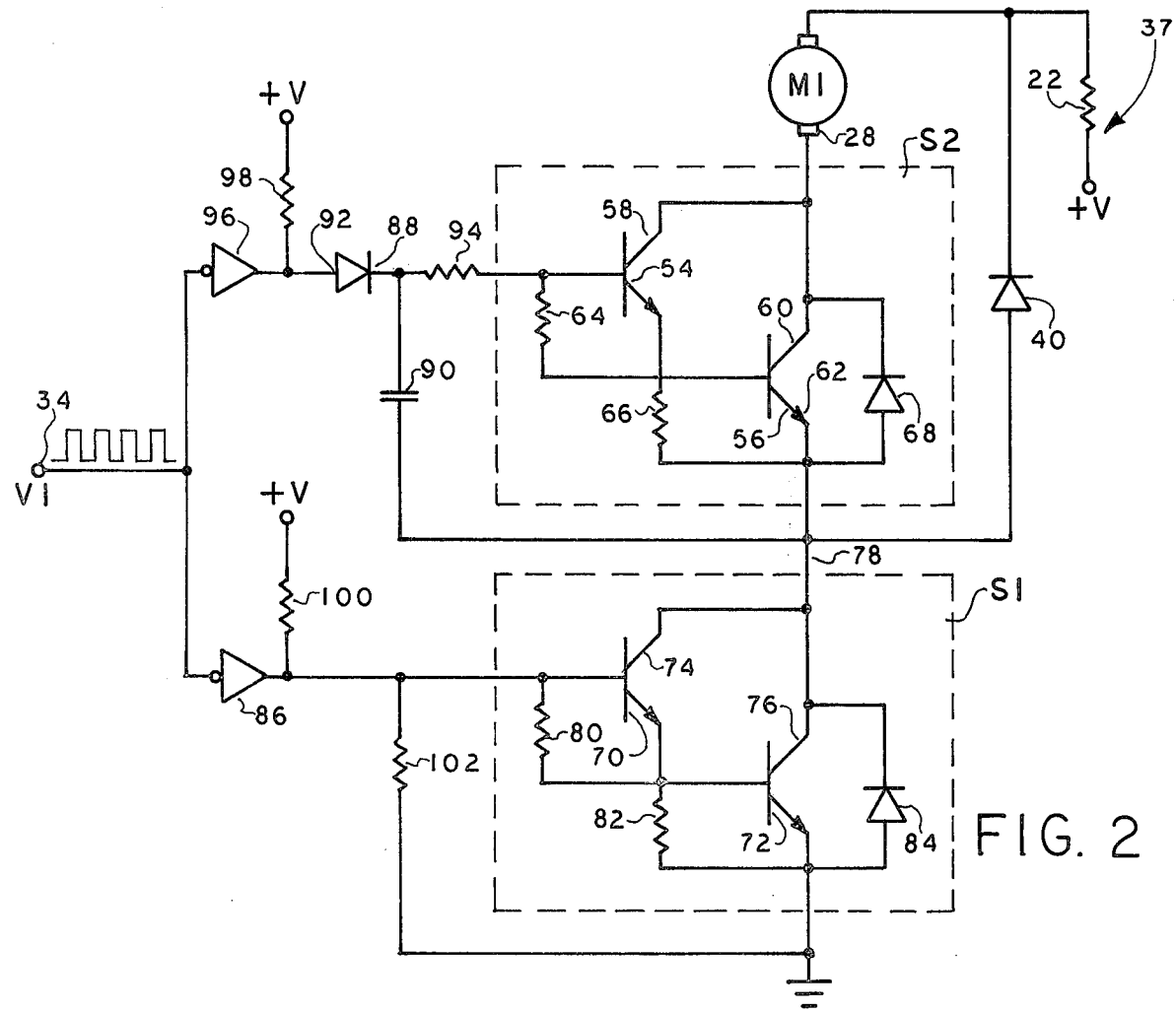
FIG. 1
FIG. 2

PROTECTIVE CIRCUIT FOR SELECTIVELY APPLYING POWER TO A MOTOR

BACKGROUND OF THE INVENTION

This invention is directed generally to protective circuits for switches and particularly to circuits for protecting switches which apply power to motors.

It is well known that when power is abruptly removed from an energized motor, the reactance associated with the motor tends to maintain the flow of motor current. If power is removed from the motor by the opening of a mechanical switch, an arc may develop across the switch contacts as the switch opens, due to the above-mentioned reaction of the motor. Where the switch is a solid state device, the reactively induced motor current may severely damage or even destroy the switch.

To protect such switches from damage, it is known to place a capacitance in a current path across the motor to absorb the reactively induced motor current. However, the capacitor itself may draw a relatively large surge of current when the switch is closed to activate the motor. Such a surge of current is generally undesirable because it may also damage the switch. In addition, the value of the capacitance selected will generally depend on the inductance and resistance associated with the motor. Thus, variations in the electrical parameters of a motor may preclude the use of a capacitance of the same value for various motors. This result is, of course, disadvantageous from a production standpoint.

The problems described above become particularly acute when the motor is pulsed at a rapid rate or must be free to rotate in two directions. In the case where the motor is pulsed at a rapid rate, a switch is usually closed and opened at a rapid rate for alternately applying and removing power from the motor. The rapid closing and opening of the switch increases the possibility of damage to the switch by the reaction of the motor.

In the case where the motor must be free to rotate in two directions, i.e., actively driven in one direction and dragged in the other direction, the inclusion of a current path around the motor for reactively generated current has an adverse effect when the motor is dragged. Specifically, the inclusion of the current path allows a current flow through the motor when the motor is dragged by virtue of the motor acting as a generator. As a result of that current, the motor is braked somewhat and cannot rotate freely. This and the above-mentioned problems associated with prior switch protection circuits has rendered such circuits less than satisfactory, particularly for use with motors which are pulsed and which must be free to rotate in both directions.

OBJECTS OF THE INVENTION

It is a general object of the invention to provide an improved protection circuit for a switch which applies and removes power from a motor.

It is a more specific object of the invention to provide a protective circuit for a switch used to apply and remove power from a motor which must be free to rotate in two directions.

It is a further object of the invention to provide a protective circuit for a switch which is rapidly closed and opened for applying and removing power from a motor.

BRIEF DESCRIPTION OF THE DRAWINGS

The above and other objects of the invention are more particularly set forth in the following detailed description and in the accompanying drawings of which:

FIG. 1 is a very schematic representation of an exemplary embodiment of the invention, illustrating two similar protective circuits for use in a web transport system wherein a web is transported between two reels by a corresponding pair of motors;

FIG. 2 is an electrical schematic diagram of one of the protective circuits shown in FIG. 1;

SUMMARY OF THE INVENTION

Figure 3:
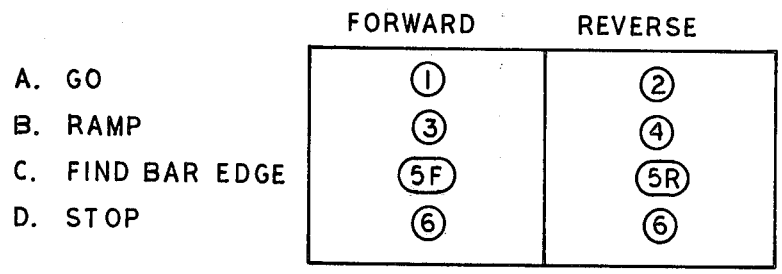
FIG. 3 is a graphic representation of various modes of operation of an exemplary web transport system in which the invention may be used for further explaining the operation and advantages of the invention.

A protective circuit according to the invention selectively applies power to a dc motor in a web transport system so as to protect a power switch for the motor and to allow the motor to rotate freely when it is unenergized.

The protective circuit includes power switch means for selectively applying and removing power from the motor, and control means for diverting motor current from the power switch means when the latter is opened, thereby protecting the power switch means from damage due to motor current which tends to continue flowing when power is removed from the motor.

The motor current which is diverted from the power switch means is directed back through the motor via a closed, preferably unidirectional current path, and the control means opens the current path after the power switch means has opened and remained open for a predetermined interval to ensure that the motor can then rotate freely.

DESCRIPTION OF THE PREFERRED EMBODIMENT

Referring now to FIG. 1, there is shown a general schematic representation of a web transport system for transporting a web 10 between a take-up spool 12 and a supply spool 14.

To rotate the reels 12 and 14, a pair of dc motors M1 and M2 are coupled to the reels by any suitable linkage as shown schematically by dashed lines 16 and 18. The motor M1 has a current input terminal 20 coupled to a power source designated +V via a current limiting resistor 22. Similarly, the motor M2 has a current input terminal 24 coupled to a power source +V via a current limiting resistor 26.

To selectively energize and de-energize the motor M1, another terminal 28 of that motor is connected to a contact 30 of a control switch S2, and the latter is serially coupled to a contact 32 of a power switch S1. As shown, the switch S1 is coupled to ground so that, upon the closing of switches S1 and S2, the power source +V is provided with a closed current path from the power source +V, through the resistor 22, the motor M1, and switches S1 and S2. When either of the switches S1 and S2 are open, power is removed from the motor M1.

Although the switches S1 and S2 are shown only schematically, it is understood that they include means for effecting their opening and closing in response to a voltage applied to the dashed lines coupled to the switches.

To selectively open and close the switch S1, the latter is coupled to a control terminal 34 which receives a voltage V1. When the voltage V1 is of a first condition, a high voltage, for example, the switch S1 is closed. Conversely, when the voltage V1 is of a second condition, a low voltage, for example, the switch S1 is opened as shown.

To open and close the switch S2, the latter is coupled to the control terminal 34 via a delay-open network 36. Briefly, the delay-open network 36 couples the voltage V1 to the switch S2 without delay whenever the voltage V1 is of a first condition suitable for closing the switches S1 and S2. Accordingly, the switches S1 and S2 close simultaneously.

When the voltage V1 is of a second condition suitable for opening the switch S1, the delay-open network 36 delays the opening of the switch S2 for a predetermined interval. More particularly, the delay-open network 36 causes the switch S2 to open only after the power switch S1 has opened and remained open for the predetermined interval. The significance of such operation is treated in more detail hereinafter.

As shown, a current path 37 around the motor M1 is formed by a conductor 38 and a diode 40 coupled between the input terminal 20 of the motor M1 and a junction 42 between the switches S1 and S2. As is described in more detail immediately below, the current path 37, switches S1 and S2, and the delay-open network 36 cooperate to selectively apply and remove power to the motor M1 so as to protect the power switch S1 from surges of reactively induced motor current as the switch S1 is opened by diverting that motor current through the path 37. Further, the path 37 is subsequently opened when the motor M1 is de-energized to prevent current from flowing through the motor m1 and the path 37 when the motor M2 is energized for transporting the web 10 to the reel 14. It can be appreciated that such movement of the web 10 will rotate the reel 12 and the motor M1 and result in a current flow through the motor M1 and the path 37 if the path 37 is not open, thereby substantially braking the rotation of the motor M1.

In operation, and assuming that the switches S1 and S2 are open as shown, a voltage V1 suitable for closing the switches S1 and S2 is applied to the terminal 34. In response, the switches S1 and S2 preferably close substantially simultaneously and power is applied to the motor M1 for rotating it in a given direction. The closing of switch S2 also closes the current path 37, but the diode 40 prevents current from the power source +V from flowing in the path 37.

When the voltage V1 assumes a condition suitable for opening the switch S1, the latter opens immediately, thereby at least temporarily removing power from the motor M1. However, the delay-open network 36 holds the switch S2 closed. Consequently, motor current which tends to continue flowing due to the reactance of the motor M1 is diverted from the switch S1, through the path 37, and back through the motor M1 as shown by the arrow. Thus, the reactively induced motor current is substantially dissipated or absorbed by its flow through the path 37 and the motor M1. The switch S1 is thus protected from damage. Without such protection, the reaction of the motor M1 to the abrupt removal of power would generally result in damaging arcs across the contacts of the switch S1, if S1 is a mechanical switch. If S1 is a solid-state switch, it may be destroyed absent such protection.

Assuming that the switch S1 remains open for a predetermined interval, the delay-open network 36 will then cause the switch S2 to open, thereby opening the current path 37. Thus, if the motor M2 is then activated to transport the web 10 to the reel 14, the resulting rotation of the motor M1 will not be braked by current flow through the motor M1 and the path 37.

If, after having been opened, the switch S1 is closed again by V1 prior to the expiration of the predetermined interval, the delay-open network 36 holds the switch S2 closed. Thus, if the voltage V1 is a pulse signal having a rapid repetition rate, the switch S1 will be rapidly closed and opened but the switch S2 will remain closed until the voltage V1 opens S1 for a duration greater than the predetermined interval. Upon that occurrence, the switch S2 will then open. Thus, the switch S1 will have been fully protected during its rapid opening and closing as long as the predetermined interval is greater than the period of any pulse in a pulse signal applied to terminal 34.

The above-mentioned rapid opening and closing of the switch S1 is used in some web transport systems to digitally control the energization of the motor M1. However, the switch S1 is normally opened and closed rapidly enough so that the motor M1 integrates the pulsed power applied to it and rotates smoothly.

In some applications, the diode 40 may be replaced by a resistance or other network, which allows current flow in two directions. However, a bi-direction current path tends to absorb mechanical energy and contribute to braking which, in some applications, is undesirable. Hence, it is preferred that the current path 37 be unidirectional as shown.

The protective circuit described above is advantageously used with both the motors M1 and M2 of FIG. 1. Thus, a power switch S3 and a control switch S4 may be disposed as shown in series with the motor M2. In addition, a current path 44 comprising a conductor 46 and a diode 48 are connected in the same manner as their corresponding elements of current path 37. A delay-open network 50 is coupled between the switch S4 and a control terminal 52 for controlling the opening and closing of the switch S4 as described above with respect to the delay-open network 36. A voltage V2 having conditions suitable for opening and closing the switches S3 and S4 is applied to the terminal 52.

With the arrangement described above, the web 10 is transported to the reel 12 when switches S1 and S2 are closed (or when S2 is closed and S1 is rapidly opened and closed). During such operation, the voltage V2 will ordinarily be of a condition to keep the switches S3 and S4 open.

To transport the web 10 in the reverse direction V1 assumes a condition to open the switches S1 and S2 and V2 assumes a condition to close switches S3 and S4 (or to close S4 and rapidly open and close switch S3).

It will be appreciated that each of the dc motors M1 and M2 has an electrical time constant associated with its internal inductance and resistance. In addition, each motor has a mechanical time constant associated with its torque and the inertia of the web transport system. Accordingly, the predetermined interval by which the delay-open network 36 delays the opening of the switch S2 should be greater than the electrical time constant and less than the mechanical time constant of the motor M1. It has been found that very satisfactory operation results when that predetermined interval is at least three times as long as the electrical time constant of the motor. Should that predetermined interval exceed the mechanical time constant of the motor, the acceleration of the motor may be retarded when it is rotated by the pull of the web 10.

A preferred construction of the switches S1 and S2 and the delay-open network 36 is shown in FIG. 2. The switch S2 includes at least one transistor and preferably a darlington-connected pair of transistors 54 and 56. The collectors 58 and 60 of the transistors 54 and 56 are tied together and connected to the terminal 28 of motor M1. The emitter 62 of transistor 56 is connected to the switch S1 and to the diode 40 as shown. Biasing resistors 64 and 66 are connected as shown to the transistors 54 and 56 and a diode 68 is connected between the collector and emitter of transistor 56.

The switch S1 also includes at least one transistor and preferably a darlington-connected pair of transistors 70 and 72. The collectors 74 and 76 of the transistors 70 and 72 are tied together and connected to the emitter of transistor 56 by lead 78. Biasing resistors 80 and 82 and a diode 84 are connected to the transistors 70 and 72 as shown.

As is well known in the art, each of the transistors 54 and 56 has an ON state for closing the path between the motor M1 and the switch S2 as well as the path 37 through the motor M1. Conversely, the transistors 54 and 56 also have an OFF state for opening the same paths.

Similarly, the transistors 70 and 72 have OFF and ON states for opening and closing the path from S2 to ground.

The transistors 74 and 76 are turned ON when the voltage V1, shown as a pulse signal, goes low. An inverter 86 converts the low V1 signal to a high signal for forward biasing the transistors 70 and 72. Conversely, the transistors 70 and 72 are turned off when the voltage V1 goes high.

The delay-open network 36 includes a diode 88 and a capacitor 90 connected as a peak detector. Specifically, the diode 88 is connected between V1 and the switch S2 such that the diode 88 conducts current in response to a high level signal at its anode 92. The capacitor 90 is connected to the cathode of the diode 88 and to the emitter of the transistor 56 such that the capacitor 90 charges when the diode 88 conducts. When the capacitor 90 charges sufficiently, it forward biases the transistors 54 and 56 to close the switch 52.

When the diode 88 stops conducting the capacitor 90 discharges slowly through a resistor 94 and transistors 54 and 56. The resistor 94 is selected so that the discharge time constant of the capacitor 90 is much greater than its charging time constant. Specifically, the discharge time constant of the capacitor 90 is selected so that the transistors 54 and 56 remain in their ON states for the predetermined interval referred to above, after which those transistors revert to their OFF state.

The diode 92 conducts when the voltage V1 is at a low level. That low level is converted to a high level signal by an inverter 96 coupled between terminal 34 and the diode 88. Conversely, the diode 88 stops conducting when the voltage V1 assumes a high level.

A resistor 98 connected between a positive voltage source and the output of inverter 96 establishes a desired dc potential at the anode of the diode 88. Similarly, resistors 100 and 102 are connected between a positive source of voltage and ground at the output of the inverter 86 for establishing a desired dc potential at the base of the transistor 70.

Although the embodiment of FIG. 2 is constructed with inverters 86 and 96, it will be apparent that inverters are not necessary if a voltage V1 of the desired polarity is available. Actually, the pulse signal which operates the switches S1 and S2 is that which appears at the output of the inverters 86 and 96. Hence, where reference is made herein to pulse signals, it is to be understood that such pulse signals are those which are applied to the delay-open network 36 and the switch S1.

Among the advantages of the structure shown in FIG. 2 is the fact that both switches S1 and S2 are actuated by the same signal at the terminal 34. The use of but one signal to operate both switches is particularly significant when the switches are driven by a control signal developed in an integrated circuit chip. With this arrangement, only one output pin is required to deliver the control signal to both switches.

The preferred construction of the protective circuit shown in FIG. 2 for use with motor M1 may also be used for the protective circuit associated with the motor M2.

In order to further demonstrate the operation and attendant advantages of the protective circuit described above, the operation thereof will be briefly explained in terms of use with a preferred type of web transport system. Such a transport system is disclosed in U.S. application Ser. No. 711,180, filed Aug. 31, 1976, and assigned to the assignee of this invention. According to the above-mentioned application, a microfiche reader has a web of microfilm wound between a pair of reels for transport between the reels by a pair of dc motors. Microfiche images are disposed throughout the length of the film, and bar codes are situated along the edge of the film to identify each image. In response to an operator's input as to which image is desired to be viewed, the reader automatically advances the web and "reads" each bar code until the desired image has been located. The reader then initiates a "homing" cycle in which the reader stops on a predetermined edge of the desired bar code for displaying the associated image squarely in the center of a viewing screen.

Typically, such a reader is capable of going through a sequence of steps as shown in FIG. 3 to locate the bar code of a desired image. As indicated, the reader operates in a GO mode in which it searches for a particular bar code at high speed. This mode is designated herein as mode 1 or mode 2, depending on whether the machine is advancing the film in a forward or reverse direction.

After a desired bar code has been found, the machine operates in a ramp mode in which at least one of the motors is pulsed with pulse signals of a constant period but steadily increasing duty cycle. This ensures that the motor is advanced slowly at first and then at increasingly greater speeds. This mode is designated herein as mode 3 or 4, depending on the direction of rotation of the web.

Next, the reader initiates a "find the edge" mode in which it "homes-in" on a specified edge of the bar code.

Modes 5F and 5R designate this latter mode of operation.

Once the reader has "homed-in" on the desired edge of the bar code, the film is stopped (mode 6). In the discussion below, the microfiche reader is described in terms of how it operates when its dc motors may be driven by the protective circuits shown in FIG. 1. To further correspond the description of the reader operation to FIG. 1, the reader motors are referred to as M1 and M2.

Figure 4:
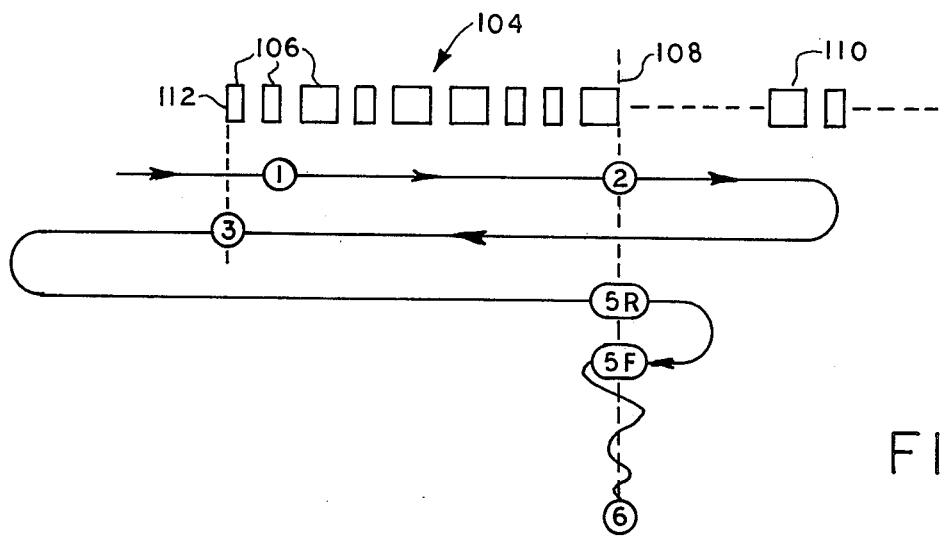
FIG. 4 is a graphic representation of the way in which the exemplary web transport system "homes in" on a selected image of the web.

Referring now to FIG. 4, some of the various modes of operation of the reader are shown graphically. The bar code which identifies the image to be displayed is represented by the bar code sequence 104 comprising a series of 9 narrow and wide marks. The edge of the bar code on which the machine is to "home" is indicated at 108. The bar code is, of course, situated along the margin of a web (not shown) such as web 10 of FIG. 1.

Figure 5:
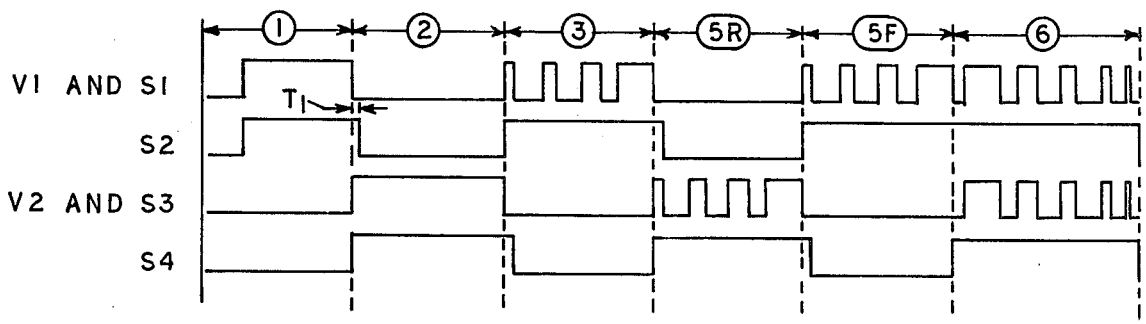
FIG. 5 illustrates waveforms for describing the operation of the protective circuit in connection with the exemplary web transport system operating in accordance with FIGS. 3 and 4.

Initially, the reader operates in mode 1 (forward GO) to quickly search for bar code 104. To begin that search, the motor M1 is energized to advancement of the film in a forward direction. FIG. 5 illustrates the conditions of V1, V2 and the switches S1-S4 for mode 1 operation as well as the other modes. Specifically, during mode 1 operation, the voltage V1 is at a high level and the switch S1 is closed (the high levels shown in FIG. 5 indicate switch closures and the low levels indicate switch openings). Note also that, during mode 1, switch S2 is closed while switches S3 and S4 remain open.

Referring to FIGS. 4 and 5, the reader identifies the bar code 104 as the desired bar code when it reaches edge 108, whereupon the reader then operates in mode 2 (reverse GO). Mode 2 is initiated by the voltage V1 going low and the voltage V2 doing high. Consequently, switches S1 and S2 open and switches S3 and S4 close. As shown in FIG. 5, the switch S2 opens later than the switch S1 by an interval T1, the predetermined interval referred to above. Thus, the switch S1 is protected from damage as it opens.

When mode 2 is initiated, the web coasts in the direction of the next successive bar code 110 and eventually begins advancing in the opposite direction as shown in FIG. 4. When the machine detects the leading edge 112 of the bar code, the machine goes into its mode 3 (ramp) operation.

At the beginning of mode 3, switch S3 opens and then switch S4 opens after the predetermined interval. To reverse the direction of the web, motor M1 is pulsed by rapidly opening and closing the switch S1 with voltage pulses. During this mode of operation, switch S2 remains closed by the delay-open network 36 (FIG. 1) because of the high repetition rate of the pulses. In the embodiment of FIG. 2, switch S2 is held closed because the capacitor 90 cannot discharge significantly.

When the reader once again reaches the edge 108 of the bar code 104 mode 5R is initiated, switch S1 opens, switch S2 then opens, and switch S3 is rapidly opened and closed by pulses of constant period and increasing duty cycle to reverse the direction of the web. Switch S4 remains closed during this mode.

As the web first coasts to the right in FIG. 4 and then advances to the left, the reader once again senses the edge 108 of the bar code 104 whereupon mode 5F is initiated. During this mode, switch S1 is again opened and closed rapidly, while S2 remains closed and switches S3 and S4 are open. As the web is advanced, the machine again senses the edge 108, whereupon the direction of web travel is again reversed.

Ultimately, the web is stopped on or very near the edge 108 as indicated by mode 6. However, between the stop mode and the last indicated 5F mode, the reader cycles between modes 5R and 5F several times to "home-in" on the edge 108.

When the stop mode 6 is begun, switches S1 and S3 are both opened and closed rapidly together for pulsing the motors M1 and M2. Because the motors M1 and M2 are now energized to rotate in opposing directions, there is no net movement of the web. The energization of the motors M1 and M2 is gradually decreased by decreasing the duty cycle of the pulses applied to the switches S1 and S3. At the end of the stop mode, switches S1-S4 all open and the reader displays the image associated with the bar code 104.

As is evident from the discussion above, the protective circuit is very advantageously used in a film reader of the type described above. The power switches which are readily opened and closed are all protected from reactively induced motor current. Further, the path to which the reactively induced motor current is diverted is automatically opened a predetermined interval after the energized motor is de-energized to allow its free rotation in an opposite direction.

The invention is, of course, not limited to use in web transport systems whose motors are rapidly pulsed, although such systems benefit the most from the invention. Nor is the invention limited to two motor systems. For example, the invention is also applicable to a single motor web transport system in which the motor powers a capstan drive between the take-up reel and the supply reel. The reels may be coupled to one another such that they are rotated and stopped in proper relation to each other.

A further advantage of the protective circuit described herein is that its operation is substantially independent of motor parameters. For example, although the inductance and resistance of motor windings vary from motor to motor, the protective circuit need not be modified to accommodate such variations. For all practical purposes, the same protective circuit may be used for any dc motor as long as the predetermined interval referred to above is greater than the electrical time constant of the motor and less than the motor's mechanical time constant. Because the mechanical time constant is generally much longer than the electrical time constant, the duration of the predetermined interval is easily designated to be somewhere between those limits, irrespective of the usual variations among similar motors.

Although the invention has been described in terms of specific structure, it will be obvious to one skilled in the art that many modifications can be made thereto without departing from the spirit and scope of the invention. Accordingly, it is intended that such modifications be included within the scope of the invention as defined by the appended claims.

What is claimed is:

1. In a web transport having at least one dc motor rotatable in two directions for transporting a web between a take-up reel and a supply reel, a protective circuit for selectively applying power to the motor, comprising:

power switch means for coupling power to the motor for rotation in a given direction when said power switch means is in a closed condition and for removing power from the motor when said power switch is in an open condition;

control means for diverting reactively induced motor current from said power switch means back through the motor via a current path when said first switch means assumes an open condition, and for automatically opening said current path after said first switch means has assumed and remained in an open condition for a predetermined interval, whereby motor current which tends to continue flowing when said power switch means assumes an open condition is caused to flow away from said switch means and through said current path, thereby protecting said power switch means from damage, and whereby the subsequent opening of said current path ensures that said motor can then be rotated freely in an opposite direction without drag.

2. A circuit as set forth in claim 1 wherein the motor has an electrical time constant associated with its internal inductance and resistance and a mechanical time constant associated with its torque and the inertia of the web transport system, and wherein said predetermined interval is greater than the electrical time constant of the motor and is less than the mechanical time constant of the motor.

3. A circuit as set forth in claim 2 wherein said predetermined interval is at least three times as long as the electrical time constant of the motor.

4. A circuit as set forth in claim 2 wherein said power switch means is adapted to receive a signal of a first condition for assuming a closed condition and is adapted to receive a signal of a second condition for assuming an open condition, and wherein said current path is provided responsive to said signal of a first condition.

5. A circuit as set forth in claim 2 wherein said current path is adapted to conduct currently only in a direction away from said power switch means.

6. A circuit as set forth in claim 5 including a diode in said current path, said diode being poled to conduct current in a direction away from said power switch means.

7. A circuit as set forth in claim 2 further including means for coupling a pulse signal of a predetermined repetition rate to said power switch means, wherein said power switch means alternates rapidly between closed and open conditions in response to alternate first and second conditions, respectively, of the pulse signal and wherein said predetermined interval is sufficiently long compared to the repetition rate of the pulse signal so that said control means is prevented from opening said current path between successive pulses having said repetition rate.

8. A circuit as set forth in claim 7 wherein said control means includes control switch means serially coupled between said power switch means and the motor, and means responsive to the pulse signal for selectively opening and closing said control switch means, said means for opening and closing said control switch means being adapted to close said control switch means in response to the pulse signal having a first condition, for holding said control switch means closed during successive first conditions of the pulse signal, and for opening said control switch means said predetermined interval after the discontinuance of successive first conditions of the pulse signal.

9. A circuit as set forth in claim 8 wherein the motor includes first and second current input terminals, wherein said control switch means is coupled to said first motor input terminal, and said current path is coupled to said second motor input terminal and to a connection between said control switch means and said power switch means.

10. A circuit as set forth in claim 9 wherein the pulse signal has a high level corresponding to said first condition and a lower level corresponding to said second condition, wherein said control switch means comprises at least one transistor having an ON state for closing said current path and an OFF state for opening said current path, wherein said means for opening and closing said control switch includes a diode disposed to conduct current in response to high levels of the pulse signals for biasing said transistor to its ON state, and a capacitor disposed to be charged by the conduction of said diode and to hold said transistor in its ON state between successive high levels of the pulse signal.

11. In a web transport system having a web would between a supply reel and a take-up reel, a first dc motor coupled to the supply reel and a second dc motor coupled to the take-up reel, and wherein at least one of said motors is pulsed to advance the web in a given direction and to thereby rotate the other motor by virtue of the pull of the web, a protective circuit for selectively applying power to the pulsed motor, comprising:
a power switch associated with the pulsed motor and adapted to receive a pulse signal of a given repetition rate for closing in response to the pulse signal having a first level and for opening in response to the pulse signal having a second level;
a control switch serially coupled between said power switch and the pulsed motor;
a dc power source coupled across the series combination of the pulsed motor and both said switches such that, upon the simultaneous closing of both switches, power is applied to the pulsed motor for rotation thereof in a given direction;
a current path coupled across the series combination of the pulsed motor and said control switch and adapted to conduct reactively induced motor current through the motor and away from said power switch only when said control switch is closed and said power switch is opened;
means for coupling the pulse signal to said power switch; and
means receiving the pulse signal and responsive to the pulse signal having said first level for closing said control switch, for holding said control switch closed during successive first levels of the pulse signal, and for opening said control switch a predetermined interval following the last in a succession of said first conditions of the pulse signal,
whereby reactively induced motor current which tends to continue flowing when said power switch is opened is caused to flow away from said power switch and through said current path, thereby protecting said power switch from damage, and whereby the opening of said control switch a predetermined interval following the last in succession of said first conditions of the pulse signal opens said current path to permit the motor to be rotated freely in an opposite direction without drag.

12. A circuit as set forth in claim 11 wherein the pulsed motor has an electrical time constant associated with its internal inductance and resistance and a mechanical time constant associated with its torque and the inertia of the web transport system, and wherein said predetermined interval is greater than the electrical time constant of the motor and is less than the mechanical time constant of the motor.

13. A circuit as set forth in claim 12 wherein the pulsed motor has first and second current input terminals, wherein said control switch is coupled to said first motor input terminal, wherein said dc power source is coupled to said second motor input terminal, and said current path is coupled between said second motor input terminal and a connection between said control switch and said power switch.

14. A circuit as set forth in claim 12 wherein the pulse signal has a high level corresponding to said first condition and a low level corresponding to said second condition, wherein said control switch comprises at least one transistor having an ON state for closing said current path and an OFF state for opening said current path, and wherein said means for closing and opening said control switch includes a diode disposed to conduct current in response to high levels of the pulse signals for biasing said transistor to its ON state, and a capacitor disposed to be charged by the conduction of said diode and to hold said transistor in its ON state between successive high levels of the pulse signal.

* * * * *